United States Patent [19]
Weber et al.

[11] Patent Number: 5,978,422
[45] Date of Patent: Nov. 2, 1999

[54] CIRCUIT FOR DETERMINING AND EVALUATING A DATA SIGNAL ON WHICH A DIRECT VOLTAGE PORTION IS SUPERPOSED

[75] Inventors: Stephan Weber; Volker Thomas, both of Munich, Germany

[73] Assignee: Siemens Aktiengesellschaft, Munich, Germany

[21] Appl. No.: 08/921,587

[22] Filed: Sep. 2, 1997

[30] Foreign Application Priority Data

Sep. 12, 1996 [DE] Germany ............................ 196 37 150

[51] Int. Cl.⁶ .................................................. H04L 25/06
[52] U.S. Cl. ............................ 375/317; 375/319; 327/307
[58] Field of Search .................... 375/317, 319; 327/307; 330/129; 250/369

[56] References Cited

U.S. PATENT DOCUMENTS

| | | |
|---|---|---|
| 4,821,292 | 4/1989 | Childress . |
| 4,873,702 | 10/1989 | Chiu ........................................ 375/319 |
| 5,132,540 | 7/1992 | Adolph et al. ............................ 250/369 |
| 5,175,749 | 12/1992 | Ficht et al. ............................... 375/319 |
| 5,408,197 | 4/1995 | Miyake .................................... 330/129 |
| 5,428,687 | 6/1995 | Willcocks . |
| 5,760,629 | 6/1998 | Urabe et al. ............................. 327/307 |

FOREIGN PATENT DOCUMENTS

| | | |
|---|---|---|
| 0 133 067 A1 | 2/1985 | European Pat. Off. . |
| 0 669 739 A3 | 8/1995 | European Pat. Off. . |
| WO 85/02962 | 4/1985 | WIPO . |

OTHER PUBLICATIONS

Patent Abstracts of Japan, E–1133, Nov. 14, 1991, vol. 15, No. 448, and JP–3–190 319 (A), dated Aug. 20, 1991, K. Kubota, Pulse Waveform Detection Circuit.
Patent Abstracts of Japan, E–1316, Feb. 5, 1993, vol. 17, No. 61, and JP–4–268 809 (A), dated Sep. 24, 1992, Y. Cho, Method and Device for Extracting Pulse Signal.
Patent Abstracts of Japan, JP 63 167 519 dated Jul. 11, 1988.

*Primary Examiner*—Stephen Chin
*Assistant Examiner*—Chieh M. Fan
*Attorney, Agent, or Firm*—Hill & Simpson

[57] ABSTRACT

A circuit for determining and evaluating a data signal with a disturbing direct voltage portion has a signal processor with which the direct voltage portion is determined and then subtracted from the signal. A non-linear control is provided that changes a time constant of the circuit in dependence on the signal curve.

11 Claims, 1 Drawing Sheet

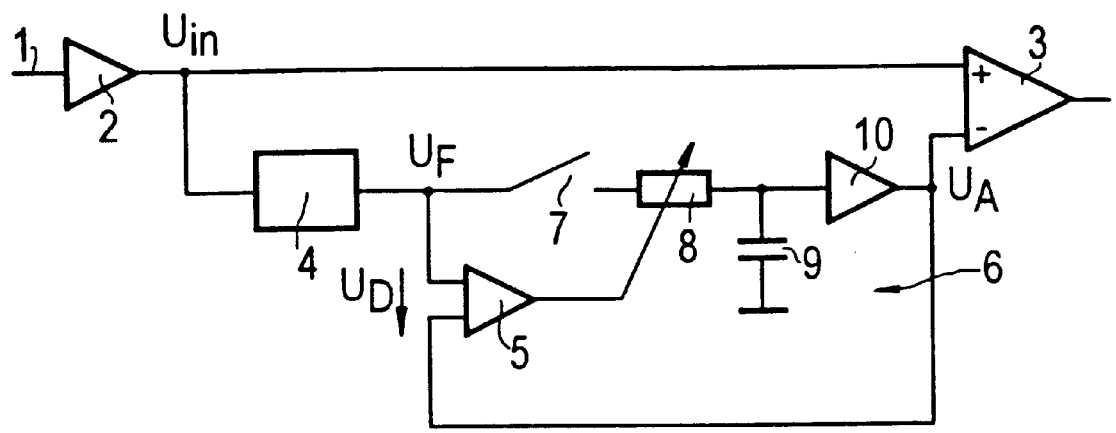
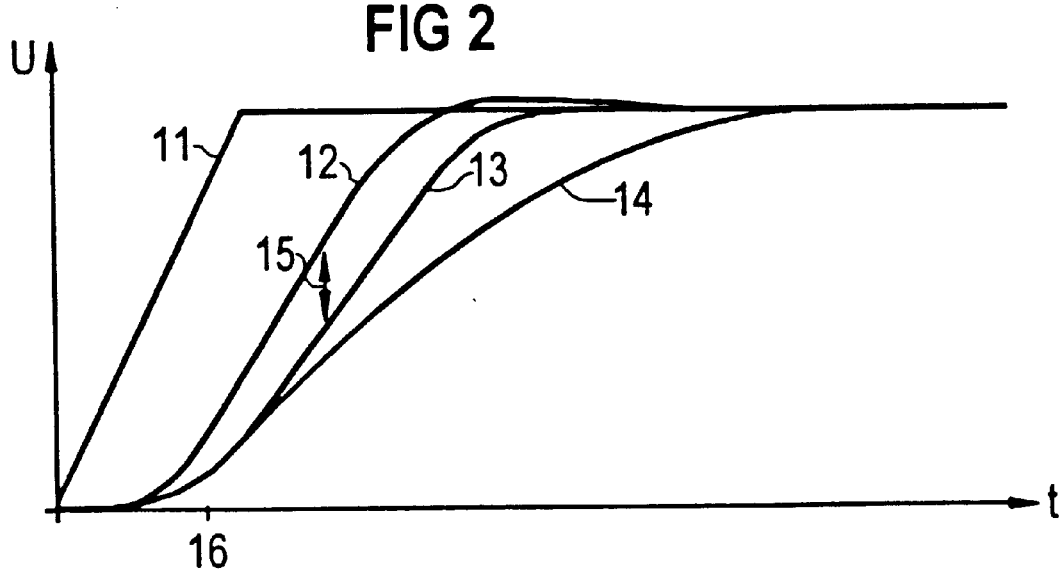

CIRCUIT FOR DETERMINING AND EVALUATING A DATA SIGNAL ON WHICH A DIRECT VOLTAGE PORTION IS SUPERPOSED

BACKGROUND OF THE INVENTION

The present invention relates to a circuit for determining and evaluating a data signal on which a direct voltage portion is superposed, with a signal input, a signal processing means that has a filter and that forwards a part of the signal, and an evaluation means that compares the original signal from the signal input with the part of the signal forwarded by the signal processing means, and that determines the data signal. The present invention also concerns a method for determining and evaluating a data signal.

Direct voltages are often superposed on a signal, caused by offset voltages, tolerances, etc. In order to enable optimal use of the operational range of the members of a signal chain, it is necessary to compensate for these direct voltages, e.g. by determination of the direct voltage portion and subsequent subtraction. Direct voltage portions, also called zero-frequency quantities, are typically determined by low-pass filtering. An example of the necessity of such a circuit is synchronization in a TDMA system (time division multiple access). By such a system is meant multiple access in the time-division multiplex method. A transmitter transmits, in what is called a preamble, an alternating signal comprising a direct voltage portion of zero. Due to the non-ideal characteristics in the transmission chain, additional direct voltage portions occur at the output of the receiver, which have to be compensated for in order to achieve an optimal transmission quality. Since in a normal data transmission direct voltage portions or particularly low-frequency portions are possible, the direct voltage portion must be determined and then stored within the preamble, which has no direct voltage portion.

An example of such a TDMA system in which these problems occur is the new European cordless telephone standard DECT (Digital European Cordless Telephone).

In a known circuit, the direct voltage portion is determined by low-pass filtering. A compromise is thereby made between speed and precision with respect to the filter cut-off frequency and the time constant, which is inversely proportional thereto. The switching point at which switching over takes place from filtering to storage is thereby particularly problematic, because the system is not synchronized. One can either switch to storage as early as possible, at the expense of precision, or wait for the transition from the preamble to the normal data. Given the use of conventional linear filters, the latter can also ensue only with limited precision, since the switchover can only be recognized after a significant delay. In this case, the formation of mean values also takes place over a part of the data, whose mean value however must not be zero. The later the recognition of the end of the preamble and the switchover to storage takes place, the more faulty the mean value determination will be. In a known solution approach, the delay is solved by forming the mean value, not of the current signal, but of a delayed signal. Simple RC elements are used for this. The jump response of such filters always has a monotone characteristic, i.e., after the end of the preamble the signal systematically drifts in one direction, thus causing considerable halting errors under some circumstances. This error becomes smaller with higher-order filters, but does not disappear completely.

SUMMARY OF THE INVENTION

It is an object of the present invention to provide a circuit of the type named above and a method with which a mean signal value can be determined and stored in a particularly precise and reliable way.

The solution of this aim ensues in that the signal processing means has a time constant control means that is controlled in dependence on the signal behind the filter.

Regarded as a whole, by means of the new solution a non-linear offset determination is carried out in which the signal behind the filter is evaluated in order to set a large or small time constant in the signal processing means, dependent on this signal.

In principle, it is possible to construct the circuit such that the filter of the signal processing means is a high-pass filter. However, the use of a low-pass filter is preferred in the signal processing means, so that in the evaluation means the signal determined by the signal processing means can be subtracted from the input signal. Moreover, the signal processing means preferably has a track and hold circuit in which the determined direct voltage portion can be stored. The track and hold circuit is basically comparable to a sample and hold circuit.

In addition, a buffer amplifier is preferably provided at the signal input, with which the incoming signals can be amplified. The evaluation means preferably has a comparator with which the signal compensation can be easily carried out.

In a preferred embodiment of the present invention, the time constant control means has a controllable resistance. This is particularly easy to realize, and is at the same time integrated into the track and hold circuit. In addition, the time constant control means preferably comprises a control unit that evaluates a difference voltage and comprises a connection to the controllable resistance. If for example the voltage difference between the filter output and the output of the track and hold circuit is large, the control unit controls the controllable resistance such that this resistance is small. A small time constant, and thereby a high speed, results therefrom in the signal processing unit.

Given small differences in voltage, the control unit sees to it that the controllable resistance is large, in order to achieve high precision and a high delay.

For this purpose, the control unit preferably has a memory for storing a comparison voltage. The voltage determined at the control unit is compared with this comparison voltage, and, for example, given a smaller measured voltage the resistance is set to "large." From a mathematical point of view, in this solution the time constant control means is operated with a step or jump function. However, a continuous non-linear relation is also possible for the operation of the inventive circuit.

In a development of the present invention, the time constant control means and the track and hold circuit, or even the entire circuit, are integrated on a chip, since no additional terminals or external components are then required. In addition, an adjustment means is preferably provided with which the comparison voltage can be changed or readjusted, so that an optimization can still be carried out during operation.

According to the present invention, the previously described circuit is operated with a method in which a difference voltage is measured with a control unit and a time constant control means is controlled in non-linear fashion in order to achieve a large time constant given small difference voltages and a small time constant given large difference voltages.

Due to the low-pass filtering, the exchange portion at the filter output is still small, and in the stationary state, i.e.

given a constant direct voltage portion that is compensated, the difference $U_D$ between the filter output and the track and hold stage is zero. This relation is used to construct the time constants of the track and hold circuit in a signal-dependent manner. Given a large difference $U_D$, the time constant is small in order to achieve a high speed, and given small difference voltages the time constant is large, in order to achieve high precision and a high delay.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a drawing of the design of an inventive circuit; and

FIG. 2 shows a graph of a jump response of an inventive circuit in comparison with other voltage curves.

DESCRIPTION OF THE PREFERRED EMBODIMENTS

FIG. 1 shows a schematic diagram of an inventive circuit. A buffer amplifier 2 is arranged at the signal input 1, which amplifier is connected directly to the positive input of a comparator 3. Behind the buffer amplifier 2, a parallel electrical connection branches to the negative input of the comparator 3. The signal processing means is arranged in this connection, which means comprises a low-pass filter 4 and a track and hold circuit 6 that are connected in series. The track and hold circuit 6 has a switching element 7, a resistance 8 connected in series thereto, and an amplifier 10. A capacitor 9, connected against ground, is located between the resistance 8 and the amplifier 10.

A time constant control means has the resistance 8 integrated into the track and hold circuit 6, which resistance is variable for the perception of its function in the time constant control means. The controllable resistance 8 is controlled by a control unit 5 that is likewise a component of the time constant control means. The control unit 5 measures a voltage difference over the track and hold circuit 6, and is connected behind the low-pass filter 4 for this purpose, so that the filter output voltage $U_F$ is applied here, and is connected on the other hand with the output voltage $U_A$, behind the track and hold circuit.

FIG. 2 graphically shows a jump response of an inventive circuit in comparison with other voltage curves. The time is thereby plotted on the X axis and the voltage is thereby plotted on the Y axis. The curve 11 reproduces the characteristic of the input voltage $U_{in}$, which is measured behind the buffer amplifier 2. The curve 12 reproduces the voltage $U_F$ measured behind the low-pass filter. The curve 14 shows the voltage curve of a conventional circuit with a linear filter, without a time constant control means $U_A$ in the region behind the track and hold circuit.

As stated above, the switching over and storage ensues in the track and hold circuit 6 only after a certain time delay. This can ensue for example at a time marked 16 in the drawing. The advantage of the circuit of curve 14 with a linear filter shows itself clearly here, in relation to the voltage curve directly behind the low-pass filter 4. The greater the circuit-conditioned deviation is from a voltage value zero to the switchover time, the larger the error. The disadvantage of the conventional circuit reproduced by the characteristic of the curve 14 then becomes apparent in the further characteristic, in which the voltage only slowly reaches the final value.

In contrast to this, the inventive circuit leads to a voltage curve designated 13. By means of the inventive non-linear filtering, the best possible voltage response is obtained in each time region. The arrow 15 indicates that an almost constant distance prevails between the curves 12 and 13, since the time constant is small in this region.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A circuit for determining and evaluating a data signal which a direct voltage portion is superposed, comprising:
   a signal input that receives a signal;
   a signal processor having a filter and that forwards a part of the received signal;
   an evaluator means that compares the received signal from the signal input with the part of the signal forwarded by the signal processor, and that determines a data signal;
   the signal processor having a time constant controller that is controlled in dependence on a signal preceding the filter, and the signal processor also having a track and hold circuit.

2. The circuit according to claim 1, wherein the entire circuit, and in particular the track and hold circuit and the time constant controller, are integrated on a chip.

3. A circuit for determining and evaluating a data signal on which a direct voltage portion is superposed, comprising:
   a signal input that receives a signal;
   a signal processor having a filter and that forwards a part of the received signal;
   an evaluator means that compares the received signal from the signal input with the part of the signal forwarded by the signal processor, and that determines a data signal;
   the signal processor having a time constant controller that is controlled in dependence on a signal preceding the filter;
   the time constant controller having a controllable resistance;
   the time constant controller also having a control unit that evaluates a difference voltage and that has a connection to the controllable resistance.

4. The circuit according to claim 3, wherein the control unit has a memory for storing a comparison voltage.

5. A method for determining and evaluating a data signal on which a direct voltage portion is superposed, comprising the steps of:
   providing an input signal;
   providing a signal processor that has a filter and that forwards a part of the input signal; and
   providing an evaluator that compares the input signal to the part of the signal forwarded by the signal processor, and that determines a data signal;
   providing in the signal processor a time constant controller that is controlled in dependence on a signal preceding the filter;

measuring a difference voltage with a control unit; and controlling the time constant controller in a non-linear fashion, in order to set a large time constant given small difference voltages and to set a small time constant given large difference voltages.

6. A circuit for determining and evaluating a data signal on which a direct voltage portion is superposed, comprising:

a signal input that receives a signal;

a signal processor having a filter and that forwards a part of the received signal; and an evaluator means that compares the received signal from the signal input with the part of the signal forwarded by the signal processor, and that determines a data signal;

the signal processor having a time constant controller that is controlled in dependence on a signal preceding the filter;

the time constant controller having a controllable resistance;

the time constant controller also having a control unit that evaluates a difference voltage and that has a connection to the controllable resistance; and the control unit having a memory for storing a comparison voltage.

7. The circuit according to claim 6, wherein the filter in the signal processor is a low-pass filter.

8. The circuit according to claim 6, wherein the signal processor has a track and hold circuit.

9. The circuit according to claim 6, wherein the circuit further comprises a buffer amplifier at the signal input.

10. The circuit according to claim 6, wherein the evaluator has a comparator.

11. The circuit according to claim 6, wherein the entire circuit, and in particular the track and hold circuit and the time constant controller, are integrated on a chip.

* * * * *